United States Patent
Kawase et al.

(10) Patent No.: US 9,614,001 B2
(45) Date of Patent: Apr. 4, 2017

(54) ACTIVE MATRIX SUBSTRATE INCLUDING SIGNAL TERMINALS ADDITIONAL SIGNAL TERMINALS AND SWITCHING ELEMENTS FOR TESTING THE ACTIVE MATRIX SUBSTRATE

(75) Inventors: Nobuyuki Kawase, Osaka (JP); Isao Ogasawara, Osaka (JP); Kazuhide Ikuta, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 639 days.

(21) Appl. No.: 13/807,021

(22) PCT Filed: Jun. 22, 2011

(86) PCT No.: PCT/JP2011/064200
§ 371 (c)(1),
(2), (4) Date: Dec. 27, 2012

(87) PCT Pub. No.: WO2012/002199
PCT Pub. Date: Jan. 5, 2012

(65) Prior Publication Data
US 2013/0099816 A1    Apr. 25, 2013

(30) Foreign Application Priority Data
Jun. 28, 2010 (JP) .................................. 2010-146334

(51) Int. Cl.
*H01L 27/15* (2006.01)
*G01R 31/26* (2014.01)
(Continued)

(52) U.S. Cl.
CPC ........ *H01L 27/156* (2013.01); *G01R 31/2601* (2013.01); *G09G 3/006* (2013.01); *G09G 3/3648* (2013.01); *G02F 2001/136254* (2013.01)

(58) Field of Classification Search
CPC .... G09G 3/006; G09G 3/3648; H01L 27/156; G01R 31/2601
(Continued)

(56) References Cited

U.S. PATENT DOCUMENTS 5,453,991 A * 9/1995 Suzuki ................ G06F 11/2733
324/750.3
5,754,266 A * 5/1998 Ohta et al. .................... 349/139
(Continued)

FOREIGN PATENT DOCUMENTS

JP    11-109410 A    4/1999
JP    2001-147650 A    5/2001
(Continued)

OTHER PUBLICATIONS

Nagata, JP 11-109410, Machine Translation JPO, p. 1-14.*
(Continued)

*Primary Examiner* — Thomas Valone
(74) *Attorney, Agent, or Firm* — Keating & Bennett, LLP

(57) ABSTRACT

An active matrix substrate includes a plurality of bus lines (1, 2) provided in a pixel region, a plurality of signal terminals (5) provided in a connection terminal region (K), connection lines (3), additional signal terminals (11), test lines (8), and switching elements (4). The switching elements (4) are divided into a plurality of groups, and can control connections between the bus lines and the test lines (8) on a group basis, and connection elements (12) that each include a diode or a switching element and connect the signal terminals (5) to each other are provided in the connection terminal region (K).

10 Claims, 14 Drawing Sheets

(51) Int. Cl.
  *G09G 3/00* (2006.01)
  *G09G 3/36* (2006.01)
  *G02F 1/1362* (2006.01)
(58) Field of Classification Search
  USPC .................................................... 324/762.03
  See application file for complete search history.

(56) References Cited

U.S. PATENT DOCUMENTS

| | | |
|---|---|---|
| 6,670,953 B1 | 12/2003 | Ozawa |
| 2001/0020988 A1* | 9/2001 | Ohgiichi ............... G02F 1/1345 349/54 |
| 2003/0137621 A1* | 7/2003 | Zhang ............... G02F 1/133514 349/106 |
| 2004/0046920 A1 | 3/2004 | Hayata et al. |
| 2011/0006780 A1 | 1/2011 | Tanimoto et al. |
| 2011/0018142 A1 | 1/2011 | Kawamura et al. |

FOREIGN PATENT DOCUMENTS

| | | |
|---|---|---|
| JP | 2004-101863 A | 4/2004 |
| JP | 2005-221598 A | 8/2005 |
| JP | 2007-171993 A | 7/2007 |
| WO | 2009/113669 A1 | 9/2009 |
| WO | 2009/139290 A1 | 11/2009 |

OTHER PUBLICATIONS

Serdis AVdeals, "What is TFT LCD", p. 1-7, 2004, http://serdis.dis.ulpgc.es/~itis-byp/NotasDeClase/informacion/Material%20Complementario/VIDEO/What%20is%20TFT%20LCD%20TV%20and%20LCD%20Monitor%20Panel.htm.*

Official Communication issued in International Patent Application No. PCT/JP2011/064200, mailed on Jul. 19, 2011.

* cited by examiner

ACTIVE MATRIX SUBSTRATE INCLUDING SIGNAL TERMINALS ADDITIONAL SIGNAL TERMINALS AND SWITCHING ELEMENTS FOR TESTING THE ACTIVE MATRIX SUBSTRATE

TECHNICAL FIELD

The present invention relates to an active matrix substrate having a pixel region provided with a plurality of bus lines, a display device, a method for testing the active matrix substrate, and a method for testing the display device.

BACKGROUND ART

As a way to test the drive of a display panel that includes an active matrix pixel region (e.g., a liquid crystal display panel), it is known to provide the display panel with elements for inputting test signals to the pixel region to turn on the pixels. For example, it has been disclosed that thin film transistors (TFTs) are provided between every adjacent gate lines in the pixel region to switch continuity between the adjacent gate lines from on to off, and vice versa (see Patent Document 1, for example). In this configuration, the value of a current that flows through two gate lines brought into conduction by the TFTs is measured.

The configuration described above requires a current input source and space for inserting all of the between-gate line transistors. Moreover, in order to carry out a current measurement, it is necessary to take the resistance and the current tolerance of the transistors into consideration. However, to increase the size of the pixel region in which images are displayed, it is necessary to reduce the size of the periphery of the pixel region. Therefore, it is difficult to secure space for placing the TFTs and the lines used for testing. For these reasons, it has been proposed to place terminals in the area for placing semiconductor chips (see Patent Documents 2 and 3, for example).

PRIOR ART DOCUMENTS

Patent Documents

Patent Document 1: JP 2001-147650 A
Patent Document 2: JP 2004-101863 A
Patent Document 3: JP 2007-171993 A

DISCLOSURE OF INVENTION

Problem to be Solved by the Invention

However, the semiconductor chips for driving liquid crystal are also preferably small in size. In the conventional technique described above, since the terminals and elements used for testing also require a certain size of space, it is difficult to place them in the semiconductor chip mounting area. Thus, when adding components for inputting signals to the pixel region, such as elements for testing, the signal input means to be added need to be small in size.

With the foregoing in mind, it is an object of the present invention to facilitate a reduction in the size of elements that are added for inputting signals.

Means for Solving Problem

The active matrix substrate disclosed in the present application includes: a plurality of bus lines provided in a pixel region; a plurality of signal terminals for inputting a driving signal to each of the bus lines, the signal terminals being provided in a connection terminal region situated outside the pixel region; connection lines for connecting the signal terminals to the bus lines; additional signal terminals for inputting a signal to the bus lines through different paths from those used in inputting the driving signal from the signal terminals, the additional signal terminals being provided outside the pixel region; additional connection lines for connecting the bus lines to the additional signal terminals; and a plurality of switching elements for controlling connections between the bus lines and the additional connection lines. The switching elements are divided into a plurality of groups, and can control connections between the bus lines and the additional connection lines on a group basis, and connection elements that each comprise a diode or a switching element and connect the signal terminals to each other are provided in the connection terminal region.

In the above configuration, the switching elements for inputting signals to each of the bus lines through different paths from those used in inputting driving signals from the signal terminals are controlled on a group basis. Further, the signal terminals for inputting driving signals to each of the bus lines through the connection lines are connected to each other through the connection elements. Therefore, if the switching elements of a given group are turned on and signals are inputted from the additional signal terminals to the bus lines of the given group, the signals will also reach the signal terminals from the bus lines through the connection lines, and be inputted to other connection lines and bus lines that are connected to each other through the connection elements. As a result, it is possible to test not only the bus lines provided in the pixel region but also the connection lines that connect the bus lines to the signal terminals for continuity. Further, since the connection elements each include a diode or a switching element, and they can be used specifically for checking continuity (breaks) of the bus lines and the connection lines, it is possible to reduce the size of the elements. Consequently, it is possible to place the elements in a downsized or minuscule semiconductor chip mounting portion, an FPC portion or the surroundings thereof.

In the above configuration, the bus lines are lines for sending signals to pixels arranged in the pixel region in a matrix. The bus lines may include a plurality of scanning signal lines for sending scanning signals to pixels in each column and a plurality of video signal lines arranged perpendicular to the scanning signal lines for sending video signals to pixels in each row.

The switching elements are divided into a plurality of groups, and are controlled to be turned on/off on a group basis. For example, by connecting control signal input terminals for the switching elements belonging to the same group to one line, the switching elements can be controlled on a group basis. That is, a control line used for controlling the switching elements to be turned on/off can be provided for each group. For example, groupings can be made based on the gate lines and the source lines, odd-numbered columns (rows) and even-numbered columns (rows), RGB, and blocks.

The connection terminal region is a region provided outside the pixel region and in which the signal terminals for connecting the bus lines to the outside of the substrate are placed. For example, in a model that was produced by a so-called COG (Chip On Glass) method, a method of directly mounting an IC on an active matrix substrate, the IC mounting portion can be defined as the connection terminal region. Alternatively, a flexible printed circuit (FPC) may be connected to the connection terminal region. Further, the connection terminal region may be provided around the IC or FPC mounting portion.

It is preferable that the connection elements are each provided between the signal terminals connected to the bus lines belonging to different groups.

By connecting to each other through the connection elements the signal terminals connected to the bus lines belonging to different groups, it is possible to input signals that have been inputted one group of bus lines to other group of bus lines through the connection lines.

The connection elements may be bidirectional diodes, unidirectional diodes or transistors.

If the signal terminals connected to the bus lines belonging to different groups are connected to each other through transistors, it is possible to cut the number of the elements into half, so that the space can be reduced. Especially, when the connection terminal region serves as an IC mounting portion where an IC is mounted, this spacing-saving effect becomes more significant due to the trends toward reductions in size of ICs. Further, when different groups are connected to each other through diodes, the diodes can serve as an anti-static pattern.

Each of the signal terminals may be configured to be connected to only one adjacent signal terminal through the connection element.

As a result, it is possible to provide one connection element for every two signals terminals of the signal terminals provided in a row. As a result, it is possible to reduce the number of the elements in the connection terminal region, so that further spacing-saving can be achieved.

The active matrix substrate may be configured to further include a short line that connects the signal terminals and an additional signal terminal for inputting a signal for turning pixels on, and the connection elements are provided between the signal terminals and the short line.

As a result, the signal terminals are connected to each other through the short line and the connection elements. Thus, test signals inputted from the additional signal terminal can be inputted to the bus lines through the short line and the signal terminals.

The active matrix substrate may be configured to include a plurality of short lines that connect a plurality of sets of the signal terminals and a plurality of additional terminals, respectively, the connection elements are provided between the signal terminal of the respective sets and each short line, and each of the sets includes the signal terminals connected to the switching elements belonging to at least one of the groups.

As a result, it is possible to input signals for turning on pixels collectively from the short lines to sets of signal terminals corresponding to the groups of bus lines. For example, signals may be inputted to all of the short lines at once or signal may be inputted from the additional signal terminals of the short lines based on the same or different groups from the groups of bus lines as needed.

The connection elements may be transistors that control connections between the signal terminals, and a gate electrode and a source electrode of each transistor may be connected to two signal terminals and a source electrode of each transistor may be connected to the short line.

As a result, it is possible to control connections between the signal terminals through the short lines.

The active matrix substrate may further include a shielding film for shielding the connection elements from external light. The shielding film can suppress external light's influence on the connection elements.

One connection element may be provided for every three continuous signal terminals, and connect the signal terminal at the center of the three signal terminals to the signal terminals on both sides. Consequently, by inputting signals to the signal terminal situated at the center, the signals can be also transmitted to the lines connected to the three signal terminals.

A display device including the above-described active matrix substrate is also one embodiment of the present invention.

The test method disclosed in the present application is a method for testing an active matrix substrate. The active matrix substrate includes: a plurality of bus lines provided in a pixel region; a plurality of signal terminals for inputting a driving signal to each of the bus lines, the signal terminals being provided in a connection terminal region situated outside the pixel region; connection lines for connecting the signal terminals to the bus lines; connection elements for connecting the signal terminals to each other in the connection terminal region; additional signal terminals for inputting a signal to each of the bus lines through different paths from those used in inputting the driving signal from the signal terminals, the additional signal terminals being provided outside the pixel region; additional connection lines for connecting the bus lines to the additional signal terminals; and a plurality of switching elements for controlling connections between the bus lines and the additional connection lines, the switching elements being divided into two or more groups. The method includes the steps of turning on connections between the additional connection lines and the bus lines belonging to at least one of the groups; and inputting signals from the additional signal terminals. The inputted signals are inputted to the bus lines through the switching elements turned on and reach the signal terminals through the connection lines, and are further inputted to other connection lines and bus lines from other signal terminals through the connection elements.

The test method disclosed in the present application is a method for testing an active matrix substrate. The active matrix substrate includes: a plurality of bus lines provided in a pixel region; a plurality of signal terminals for inputting a driving signal to each of the bus lines, the signal terminals being provided in a connection terminal region situated outside the pixel region; connection lines for connecting the signal terminals to the bus lines; a short line connected to the signal terminals; connection elements provided between the signal terminals and the short line; additional signal terminals for inputting a signal to each of the bus lines through different paths from those used in inputting the driving signal from the signal terminals, the additional signal terminals being provided outside the pixel region; additional connection lines for connecting the bus lines to the additional signal terminals; and a plurality of switching elements for controlling connections between the bus lines and the additional connection lines, the switching elements being divided into two or more groups. The method includes the steps of turning on connections between the additional connection lines and the bus lines belonging to at least one of the groups; inputting signals from the additional signal terminals; allowing the inputted signal to be inputted to the bus lines through the switching elements turned on; and inputting, through the short line and the connection elements, signals for turning on pixels of the bus lines to which the inputted signals have been inputted.

The above test methods may further include the step of severing at least a part of the connection elements after testing the pixels using the signals for turning on pixels.

Effects of the Invention

According to the active matrix substrate disclosed in the present application, it is possible to facilitate a reduction in the size of elements that are formed on the outside of the panel display portion.

DESCRIPTION OF THE INVENTION

Hereinafter, more specific embodiments of the present invention will be described with reference to the drawings. The following embodiments show exemplary configurations of the display device of the present invention being embodied in the form of a liquid crystal display device.

For convenience of explanation, each of the drawings that is to be referred to in the following schematically shows only the main members required to describe the present invention, among the constituent members of the embodiments of the present invention. Therefore, the display device of the present invention may include any constituent members that are not shown in the following drawings that are referred to herein. The size of and size ratio of the constituent members in the following drawings do not exactly reflect those of the actual constituent members.

(Embodiment 1)

Hereinafter, preferred embodiments of the active matrix substrate and the display device of the present invention will be described with reference to the drawings. In the following description, the present invention is applied to a transmission-type liquid crystal display device as an example.

<Exemplary Configuration of Liquid Crystal Panel>

Figure 1:
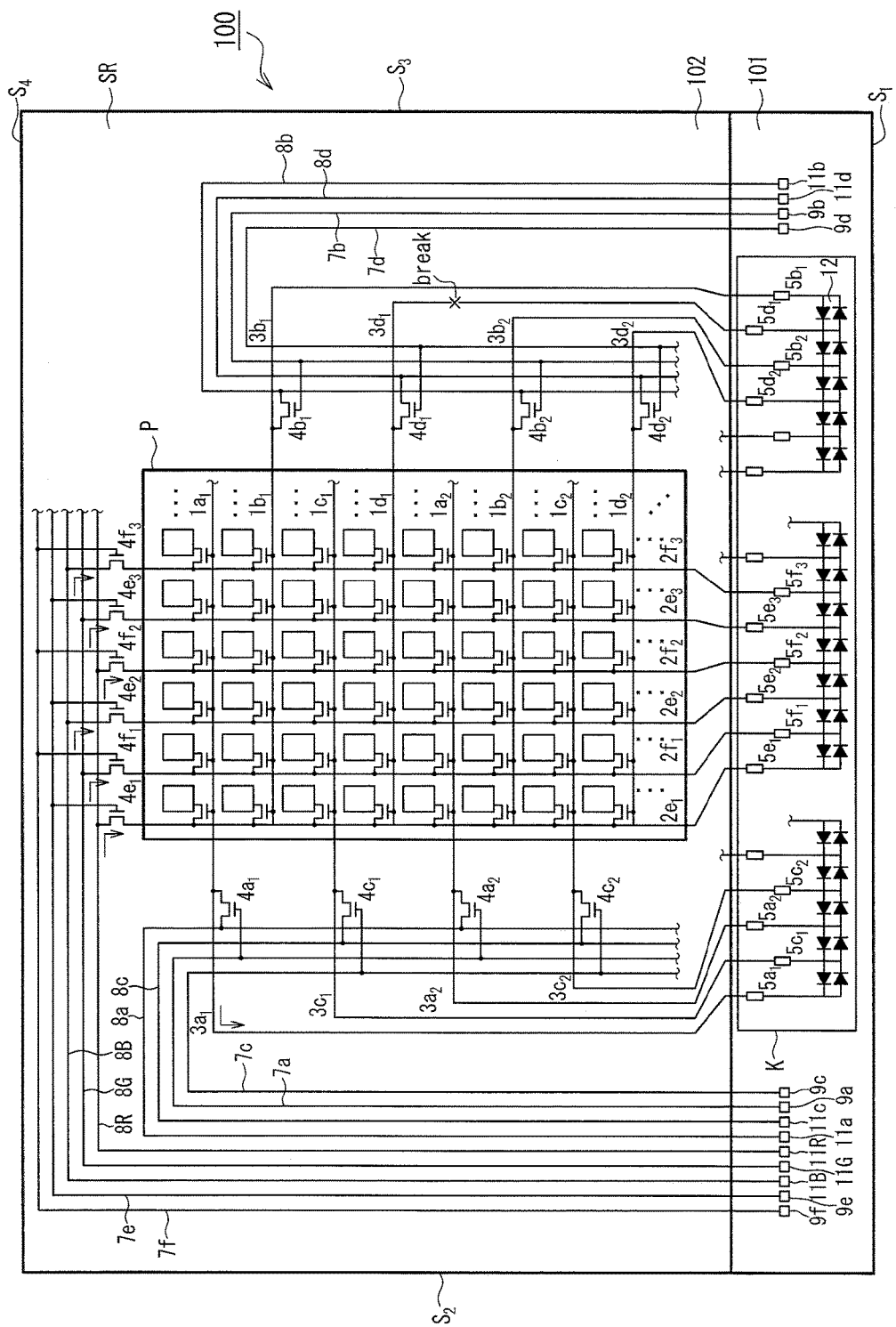
FIG. 1 is a plan view showing a schematic configuration of a liquid crystal panel according to Embodiment 1.

FIG. 1 is a plan view showing a schematic configuration of a liquid crystal panel 100 according to Embodiment 1. As shown in FIG. 1, the liquid crystal panel 100 includes an active matrix substrate 101 and a counter substrate 102 opposing the active matrix substrate 101. A liquid crystal material (not shown) is sandwiched between the active matrix substrate 101 and the counter substrate 102. In order to show the layout of lines and electrodes on the active matrix substrate 101, the counter substrate 102 and the liquid crystal layer are shown in perspective view in FIG. 1.

The counter substrate 102 used in the present embodiment includes a color filter layer having R (red), G (green), and B (blue) color filters and a black matrix for preventing leakage of light from the color filters. A common electrode is formed on the color filter layer.

It should be noted that the above counter substrate is merely an example, and the scope of the counter substrate includes counter substrates of various specifications, for example, a substrate including color filters containing color materials of more than three colors or color materials whose colors are completely different from the three primary colors, a transparent or semi-transparent substrate containing no color material, a substrate including no common electrode, a substrate including only a shielding layer, a substrate having a touch input function, and a mere substrate without any of the structures mentioned.

The active matrix substrate 101 includes a pixel region P, a connection terminal region K, and a frame-shaped wiring region SR situated outside the pixel region P and surrounding the pixel region P. Further, pixel electrodes, thin film transistors (TFTs), and the like are formed between the active matrix substrate 101 and the liquid crystal layer in relation to a plurality of pixels included in the pixel region P (display surface) of the liquid crystal panel 100.

In the following, one of the sides of the liquid crystal panel 100 close to the connection terminal region K will be referred to as a first side $S_1$ (the lower side in FIG. 1), the left and the right sides opposing each other through the first side $S_1$ will be referred to as a second side $S_2$ and a third side $S_3$, respectively, and the side opposing the first side $S_1$ will be referred to as a fourth side $S_4$.

Here, as shown in FIG. 1, the second side $S_2$ (the third side $S_3$) of the active matrix substrate 101 is larger than the second side $S_2$ (the third side $S_3$) of the counter substrate 102 in length. Thus, when the active matrix substrate 101 and the counter substrate 102 are put together through the liquid crystal material, the connection terminal region K of the active matrix substrate 101 is situated close to the first side $S_1$ and outside of the counter substrate 102.

In the pixel region P, a plurality of scanning lines $1a_1$, $1b_1$, $1c_1$, $1d_1$, $1a_2$, $1b_2$, $1c_2$, $1d_2$, ... $1a_m$, $1b_m$, $1c_m$, and $1d_m$ (hereinafter, they will be collectively referred to as the scanning lines 1 as needed. The same goes for data lines 2, connection lines 3, transistors 4, signal terminals 5, and the like), and a plurality of data lines $2e_1$, $2f_1$, $2e_2$, $2f_2$, 2 ... $2e_n$, and $2f_n$ orthogonal to the scanning lines 1 are formed. The scanning lines and the data lines can be referred to as gate lines and source lines, respectively. Further, the data lines are also referred to as signal lines in some cases. Note that the scanning lines 1 and the data lines 2 are examples of the bus lines.

On a transparent glass or transparent synthetic resin base (not shown) included in the active matrix substrate 101, the scanning lines 1 and the data lines 2 are arranged in a matrix so as to cross each other. That is, the data lines 2 are arranged on the base so as to be parallel to the column-wise direction of the matrix (the vertical direction of the liquid crystal panel 2) and the scanning lines 1 are arranged on the base so as to be parallel to the row-wise direction of the matrix (the lateral direction of the liquid crystal panel 2).

Although not being shown, lines other than the scanning lines and the data lines may be provided in the pixel region P as needed. For example, auxiliary capacitance lines for generating auxiliary capacitance may be provided.

A thin film transistor as a switching element and a pixel having a pixel electrode connected to the thin film transistor are provided in the vicinity of each intersection of the scanning and data lines 1, 2. Further, in the pixel region P, a common electrode is formed so as to oppose the pixel electrode of each pixel through the liquid crystal layer. That is, in the active matrix substrate 101, a thin film transistor, a pixel electrode and a common electrode are provided for each pixel.

Further, in the active matrix substrate 101, each segment of the area that is divided into a matrix by the scanning lines 1 and the data lines 2 has a plurality of pixel regions including red (R), green (G) and blue (B) pixels. These R, G, and B pixels are arranged, for example, in this order in succession so as to be parallel to the respective data lines $2e_1, 2f_1, \ldots 2e_n$, and $2f_n$. Furthermore, these R, G and B pixels can each display a corresponding color through the color filter layer (not shown) provided on the counter substrate 102.

The connection terminal region K of the active matrix substrate 101 is a region where the signal terminals 5 for inputting driving signals to the scanning lines 1 and the data lines 2 are placed. For example, in the connection terminal region K, a driver (not shown) or a flexible printed circuit (not shown) provided with a driver is connected to the signal terminals 5. As a result, the scan lines 1 and the data line 2 are connected to the driver electrically.

Specifically, in the connection terminal region K, the signal terminals $5a_1, 5b_1, 5c_1, 5d_1, \ldots 5a_m, 5b_m, 5c_m$, and $5d_m$ for inputting scanning signals to the scan lines $1a_1, 1b_1, 1c_1, 1c_1, \ldots 1a_m, 1b_m, 1c_m$, and $1d_m$, respectively, and the signal terminals $5e_1, 5f_1, \ldots 5e_n$, and $5f_n$ for inputting video signals to the data lines $2e_1, 2f_1, \ldots 2e_n$, and $2f_n$, respectively, are provided. Connection lines $3a_1, 3b_1, 3c_1, 3d_1, \ldots 3a_m, 3b_m, 3c_m$ and $3d_m$ connect the scanning lines $1a_1, 1b_1, 1c_1, 1d_1, \ldots 1a_m, 1b_m, 1c_m$, and $1d_m$ to the signal terminals $5a_1, 5b_1, 5c_1, 5d_1, \ldots 5a_m, 5b_m, 5c_m$, and $5d_m$, respectively. Each signal terminal 5 is connected to both adjacent signal terminals via a bidirectional diode 12. A bidirectional diode can be defined as a diode composed of two diodes of opposite polarities (the direction in which a current flows) being connected to each other in parallel.

The signal terminals 5a, 5b, 5c, 5d connected to the scanning lines 1 serve as terminals to which scanning signals are inputted from the driver. Further, the signal terminals 5e, 5f connected to the data lines 2 serve as terminals to which data signals are inputted from the driver. It is possible to connect the driver to the connection terminal region K by, for example, a COG (Chip On Glass) method. Further, it is possible to connect a flexible printed circuit provided with a driver to the connection terminal region K by, for example, a TCP (Tape Carrier Package) method. Herein, the connection method to be taken is not particularly limited.

In the example shown in FIG. 1, only one driver can be placed in the connection terminal region K, but this is not the only configuration that can be taken. For example, the active matrix substrate 101 may be provided with two or more connection terminal regions K and include two or more drivers placed in the respective connection terminal regions K.

Further, the driver placed in the connection terminal region K outputs scanning signals (gate signals) to the scanning lines 1 one after another. Each scanning signal turns on the gate electrodes of the thin film transistors that correspond to the scanning line to which it is inputted. Further, the driver outputs to the data lines 2 data signals (voltage signal (gradation voltage) each corresponding to the brightness (gradation) of a displayed image.

In addition to the constituent members described above, the active matrix substrate 101 includes additional signal terminals 11 for inputting signals to the scanning lines 1 and the data lines 2 through different paths from those used in inputting signals to the scanning lines 1 and the data lines 2 from the signal terminals 5. To the additional signal terminals 11, signals for testing whether pixels get turned on or not (hereinafter simply referred to as test signals) are inputted. Hereinafter, a case where test signals are inputted to the additional signal terminals 11 will be explained. It should be noted that this is not the only use of the additional signal terminals 11.

Further, in the frame-shaped wiring region SR, additional connection lines 8 for connecting the additional signal terminals 11 to the scanning lines 1 and to the data lines 2 are formed, and transistors 4 (one example of the switching elements) for controlling connections between the additional connection lines 8 and the scanning lines 1 and connections between the additional connection lines 8 and the data lines 2 are further provided.

The transistors 4 are for switching from on to off and vice versa signal inputs from the additional signal terminals 11 to the scanning lines 1 and the data lines 2. The transistors 4 are divided into a plurality of groups, and can control signal inputs to be enabled/disabled on a group basis. In the present embodiment, a control line for inputting control signals to the transistors 4 and a control signal terminal 9 connected to the control line are provided for each group.

For example, in the example shown in FIG. 1, odd-numbered (1st, 3rd, 5th . . . ) scanning lines 1a, 1c of the scanning lines 1 are connected to the additional connection lines 8a, 8c, respectively, through the transistors 4a, 4c provided on the left side (close to the side $S_2$) of the frame-shaped wiring region SR. The transistors 4a, 4c on the left side are further divided into two groups (A, C). The transistors 4a are connected to the control line 7a and the control signal terminal 9a, and the transistors 4c are connected to the control line 7c and the control signal terminal 9c, independently on a group basis. That is, the gate electrodes of the transistors $4a_1$ and $4a_2$ of the group A are connected to the control line 7a and the control signal terminal 9a of the group A, and the gate electrodes of the transistors $4c_4, 4c_2$ of the group C are connected to the control line 7c and the control signal terminal 9c of the group C. As a result, the groups A and C can control test signal inputs to be enabled/disabled independently.

Even-numbered (2nd, 4th, 6th . . . ) scanning lines 1b, 1d of the scanning lines 1 are connected to the additional connection lines 8b, 8d, respectively, through the transistors 4b, 4d provided on the right side (close to the side $S_3$) of the frame-shaped wiring region SR. The transistors 4b, 4d on the right side are further divided into two groups (B, D). The transistors 4b are connected to the control line 7b and the control signal terminal 9b, and the transistors 4d are connected to the control line 7d and the control signal terminal 9d, independently on a group basis. That is, the gate electrodes of the transistors $4b_1$ and $4b_2$ of the group B are connected to the control line 7b and the control signal terminal 9b of the group B, and the gate electrodes of the transistors $4d_1$, $4d_2$ of the group D are connected to the control line 7d and the control signal terminal 9d of the group D. As a result, the groups B and D can control test signal inputs to be enabled/disabled independently.

The data lines 2 are connected to the additional connection lines 8R, 8G, 8B through the transistors 4e, 4f provided in the frame-shaped wiring region SR on the upper side (close to the side $S_4$) with respect to the pixel region P. The transistors 4e, 4f are divided into two groups (E, F), and the transistors 4e are connected to the control line 7e and the control signal terminal 9e and the transistors 4f are connected to the control line 7f and the control signal terminal 9f, independently on a group basis. That is, the gate electrodes of the transistors $4e_4$, $4e_2$, . . . of the group E are connected to the control line 7e and the control signal terminal 9e of the group E, and the gate electrodes of the transistors $4f_1$, $4f_2$, . . . of the group F are connected to the control line 7f and the control signal terminal 9f of the group F. As a result, the groups E and F can control test signal inputs to be enabled/disabled independently.

Note that the groupings are not limited to the example described above. For example, the transistors for the data lines 2 can be divided into a group of transistors that are connected to data lines for R (red) gradation data, a group of transistors that are connected to data lines for G (green) gradation data, and a group of transistors that are connected to data lines for B (blue) gradation data.

<Operation Example During Test>

Figure 2:
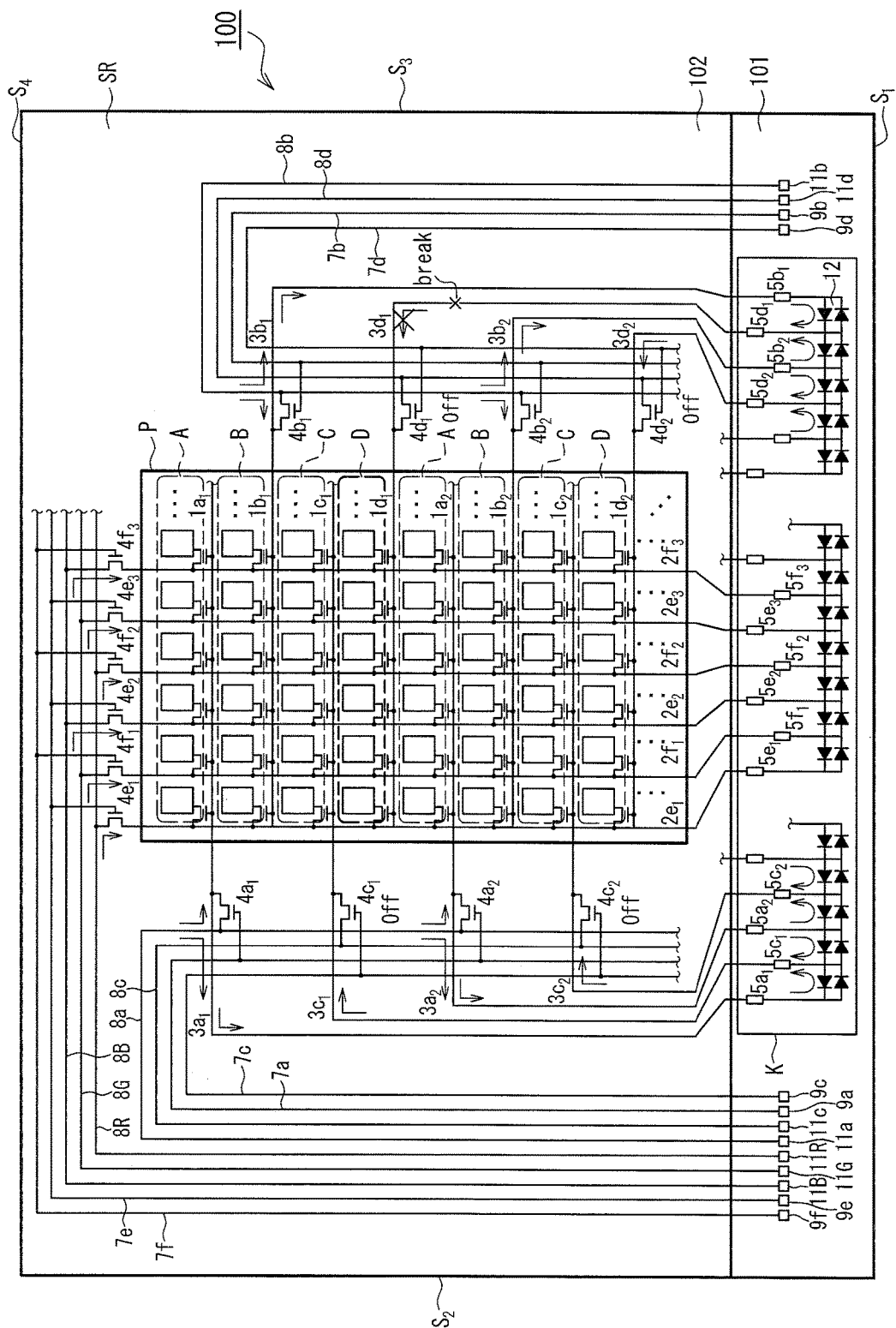
FIG. 2 is a diagram for explaining one example of a method for testing pixels of the liquid crystal panel shown in FIG. 1.

FIG. 2 is a diagram for explaining one example of a test on pixels of the liquid crystal panel 100. Hereinafter, one example of a method for checking whether there is any break in each of the bus lines (the scanning lines 1 and the data lines 2) from the connection terminal region K to the pixel region P will be explained with reference to FIG. 2.

First, of the transistors 4 for switching from on to off and vice versa connections between the scanning lines 1 and the additional connection lines 8, the transistors $4c_1$, $4c_2$ of the group C and the transistors $4d_1$, $4d_2$ of the group D are turned off, and the transistors 4 belonging to the remaining groups (A, B, E, F), i.e., the transistors 4a, 4b, 4e, 4f, are turned on. In this state, test signals are inputted from the additional signal terminals 11a, 11b. It is desirable that the test signals inputted to the scanning lines at this time are at a low frequency (or a DC potential). Further, test signals are inputted to the data lines 2e, 2f from the additional signal terminals 11R, 11G, 11B.

As a result, the test signals are inputted to the scanning lines 1a of the group A through the transistors 4a and the test signals are inputted to the scanning lines 1b of the group B through the transistors 4b. Further, the test signals that have been inputted to the groups A and B are inputted to the scanning lines 1c of the group C and the scanning lines 1d of the group D (and d) through the diodes 12 in the connection element region K. That is, the test signals that have been inputted to the scanning lines through the transistors 4a, 4b pass through the connection lines 3a, 3b and reach the signal terminals 5b. Then, they enter the connection lines 3c, 3b from the adjacent signal terminals 5c, 5d through the diodes 12, and are inputted to the scanning lines 1c, 1d. Here, if there is a break in the connection line $3d_1$ as shown in FIG. 2, no test signal will be inputted to the scanning line $1d_1$. As a result, the pixels of the group d corresponding to the scanning line $1d_1$ do not get turned on. Consequently, the break in the connection line $3d_1$ can be detected.

When inputting test signals to the bus lines of a given group, by disabling inputs from the test lines for the bus lines of other groups that are connected to each other through the signal terminal-connecting diodes 12, it is possible to input the test signals to the other bus lines through the diodes 12 as in the above example. As described above, by connecting to each other the signal terminals of bus lines of different groups (e.g., between the signal terminals 5a and 5c) through the bidirectional diodes 12, it is possible to test not only the bus lines (the scanning lines 1a to 1d) of the respective groups (e.g., the groups A to D) but also the connection lines (3a to 3d) that connect the respective groups to each other for breaks.

Note that the test method is not limited to the one described above. For example, by turning on the transistors of only one group, i.e., the transistors 4e or 4f for switching from on to off and vice versa test signal inputs to the data lines 2e, 2f, (e.g., the transistors 4e of the group E), test signals can be inputted to the data lines 2e of the group E. In this case, the test signals are inputted to the data lines 2e of the group E from the test lines 8 through the transistors 4e, and test signals are inputted to the data lines 2f of the group F through the connection lines and the signal terminals 5e, 5f. Therefore, it is possible to test not only the data lines 2e of the group E and the data lines 2f of the group F but also in the connection lines that connect the data lines 2e to the signal terminals 5e and the data lines 5f to the signal terminals 5f for breaks.

<Configuration of Diode for Connecting Signal Terminals>

In the test method described above, the diodes 12, each of which is provided between signal terminals in the connection terminal region K, are used to clarify differences in display state among pixels, which differences results from the presence or absence of breaks in the lines. In this way, by configuring the diodes 12 in the connection terminal region K to be used specifically for checking a break in the bus lines and the connection lines, the diodes 12 can be reduced in size. Further, the diodes 12 can also serve as an antistatic pattern.

Figure 3A:
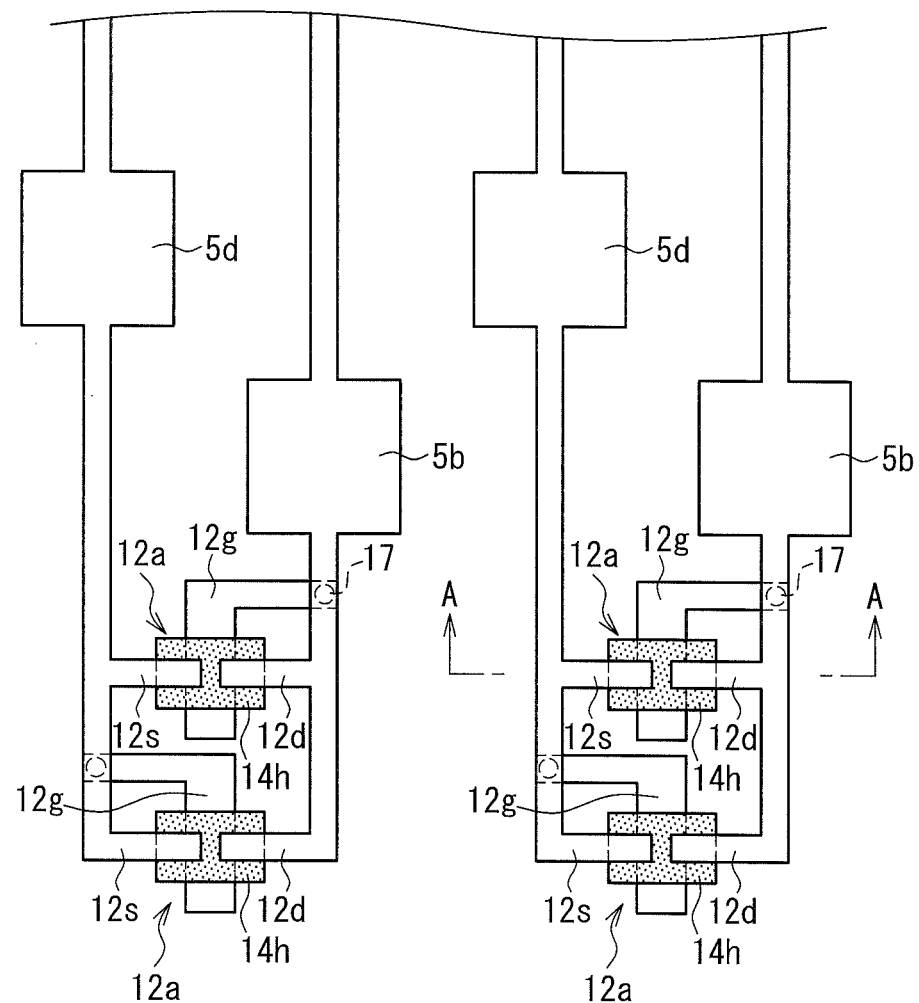
FIG. 3A is a plan view showing an exemplary configuration of bidirectional diodes, each of which connects signal terminals in a connection terminal region K to each other.
Figure 3B:
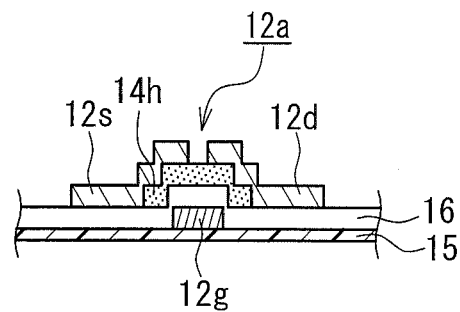
FIG. 3B is a cross-sectional view along the line A-A shown in FIG. 3A.

FIG. 3A is a plan view showing an exemplary configuration of the bidirectional diodes 12 in the connection terminal region K, each of which connects the signal terminals 5 to each other. FIG. 3B is a cross-sectional view along the line A-A shown in FIG. 3A.

In the example shown in FIGS. 3A and 3B, two diodes 12a with opposite directions are connected to each other in parallel between two lines extending from electrodes forming the signal terminals 5. One of the two diodes 12a is formed by a transistor whose gate and drain are connected to each other and the other diode is formed by a transistor whose gate and source are connected to each other.

Specifically, between lines extending from electrodes forming the signal terminals 5b, 5d, a source electrode 12s extends inwardly from one of the lines and a drain electrode 12d extends inwardly from the other line, and they oppose each other around midway between the two lines. The gate electrode 12g is provided such that it runs below the area between the tip of the source electrode 12s and the tip of the drain electrode 12d, and partially overlaps with the tip of the source electrode 12s and the tip of the gate electrode 12g. An insulating layer 16 is provided on the gate electrode 12g such that the gate electrode 12g is covered with the insulating layer 16. And on the insulating layer 16, a semiconductor layer 12h is formed so as to overlap with the gate electrode 12g. The semiconductor layer 14h is formed in the area from the tip of the source electrode 12s to the tip of the drain electrode 12d. Of the semiconductor layer 14h, the area between the gate electrode 12g and the source electrode 12s is a source area, and the area between the gate electrode 12g and the drain electrode 12d is a drain area. Of the semiconductor layer 14h, the area between the source area and the drain area serves as a channel area. The gate electrode 12g is connected to one of the lines extending from the signal lines through, for example, a contact hole 17.

Note that the configuration of the diodes is not limited to the example shown in FIGS. 3A and 3B. For example, a PN connection using P and N areas aligned in order can be used in place of a transistor connection.

The diodes 12a, 12b shown in FIG. 3 are used, for example, to connect signal terminals to each other in order to test a break in the bus lines and the connection lines. In contrast, if elements such as current measuring transistors and lighting transistors are to be placed in the connection terminal region K, they need to have a certain size in order to reduce resistance and to ensure allowable current. In this case, the elements are expected to become larger in size than the diodes shown in FIG. 3. The same goes for the case of using either a-Si or p-Si.

Further, for a testing purpose, it may be considered to take an approach of providing switching elements, such as Tr, in the connection terminal region K (e.g., the IC mounting portion), the input ends of the lines inside the panel, i.e., the bus lines such as the scanning lines 1 and the data lines 2 and the connection lines 3. In this case, if elements for display and current measuring purposes that have a certain level of resistance or allowable current or high mobility (polycrystal Si channel) are used, it will be difficult to secure the space for placing these elements. This is because, in recent years, COG IC chips are required to be small in size and to high definition compatible. Therefore, by placing between signal terminals the diode 12 for testing continuity, and controlling test signal inputs on a group basis through the test lines 8 and the transistors 4 as in the above embodiment, it is possible to reduce the size of the testing elements provided in the connection terminal region K.

<Modified Examples>

Here, modified examples of the connection elements will be described. Note that the connection elements may take forms other than the modified examples described below. Further, the modified examples described below can also be applied to other embodiments described later.

Figure 4A:
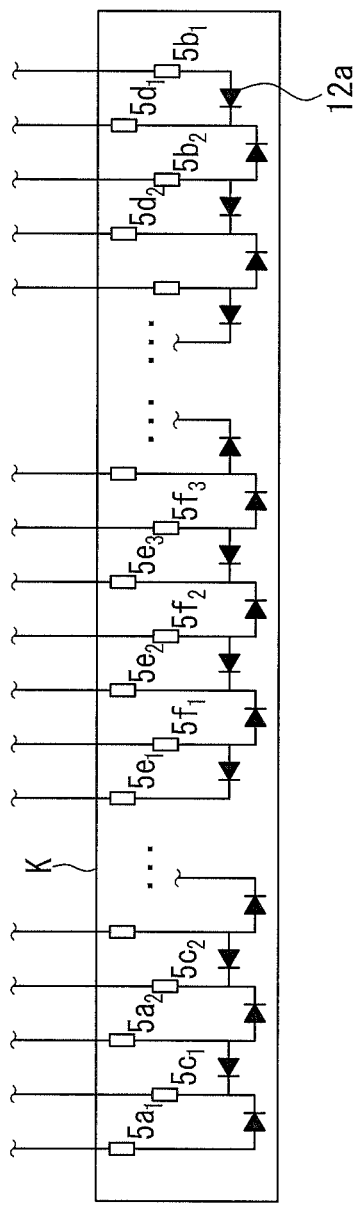
FIGS. 4A to 4I are diagrams showing modified examples of connection elements.

FIG. 4A is a diagram showing a modified example of the diodes 12. In the example shown in FIG. 4A, each unidirectional diode is provided between the signal terminals 5 in place of the bidirectional diodes. Even with the configuration shown in FIG. 4, it is possible to test a break in lines as in the above-described operations. In this way, by using unidirectional diodes as the connection elements, the space for placing the connection elements can be further reduced.

Figure 4B:
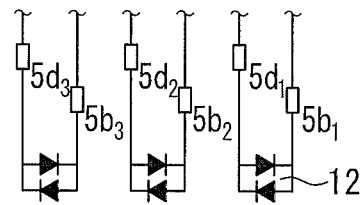

In the example shown in FIG. 4B, each signal terminal is connected to only one adjacent signal terminal through one bidirectional diode 12. In this way, it is possible to provide one bidirectional diode for every two signal terminals of the signal terminals 5 provided in a row. According to this configuration, the number of the connection elements (e.g., diodes) can be reduced, so that the space for placing the connection elements can be further reduced. In the example shown in FIG. 4B, every two signal terminals belonging to different groups (here, the groups A and C as an example), i.e., the signal terminals 5a and 5c, are connected to each other through one bidirectional diode but signal terminals belonging to the same group may be connected to each other through one bidirectional diode.

Figure 4C:
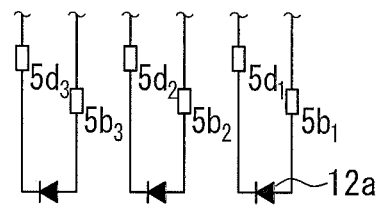

Furthermore, as shown in FIG. 4C, unidirectional diodes 12a can be used as connection elements in place of the bidirectional diodes. In this case, the space for placing the connection elements can be further reduced.

Figure 4D:
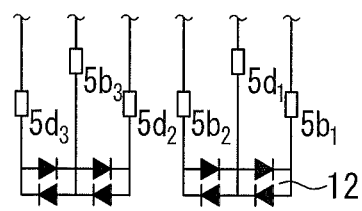

In the example shown in FIG. 4D, one signal terminal is connected to both adjacent signal terminals through the bidirectional diodes 12. That is, two bidirectional diodes 12 for connecting signal terminals to each other are provided for every three signal terminals. According to this configuration, it is possible to check whether there is any break in lines by inputting signals to, of the three signal terminals (e.g., $5b_1$, $5d_1$, $5b_2$), only the signal terminal sitting at the center ($5d_1$). Further, the three signal terminals connected to each other through the diodes 12 may include signal terminals belonging to different groups as shown in FIG. 4D. Alternatively, three signal terminals belonging to the same group may be connected to each other through the diodes.

Figure 4E:
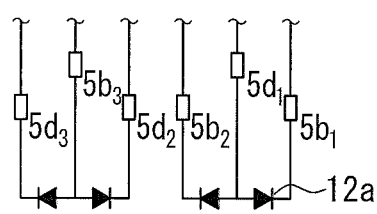
Figure 4F:
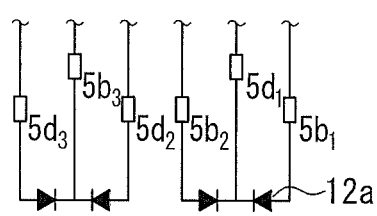

In the example shown in FIG. 4E, the unidirectional diodes 12a are provided such that a current flows from one signal terminal to both adjacent signal terminals. In the example shown in FIG. 4F, the unidirectional diodes 12a are provided such that a current flows to one signal terminal from both adjacent signal terminals. That is, the diodes 12a in FIG. 4F have an opposite polarity from that of the diodes 12a shown in FIG. 4E. In this way, by using the unidirectional diodes 12a, it is possible to restrict the voltage direction as well as to further reduce the space for placing the connection elements.

Figure 4G:
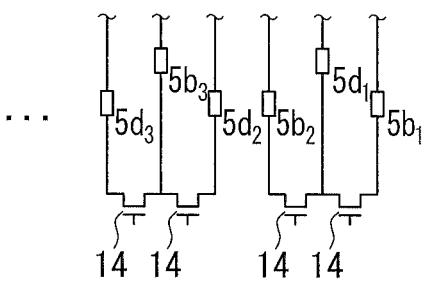

In the example shown in FIG. 4G, transistors are used as connection elements in place of the diodes. The source electrode of each transistor is connected to one signal terminal and the drain electrode of each transistor is connected to the other signal terminal. The gate electrode is connected to, for example, a line over which a control signal for controlling the transistor to be turned on/off is transmitted.

Figure 4H:
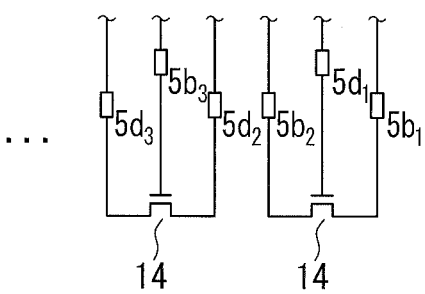

In the example shown in FIG. 4H, three signal terminals are connected to each other through one transistor 14. The gate electrode of the transistor is connected to the signal terminal $5d_1$ sitting at the center, and the source electrode and the drain electrode of the transistor are respectively connected to the signal terminals $5b_1$, $5d_2$ sitting on both sides of the signal terminal $5d_1$.

Figure 4I:
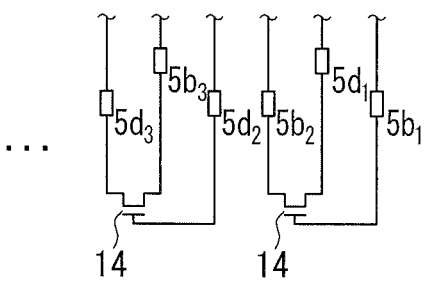

In the example shown in FIG. 4I, the source electrode and the drain electrode of each transistor are respectively connected to two adjacent signal terminals, and the gate electrode of each transistor is connected to a signal terminal adjacent to the two transistors. The example shown in FIG. 4I is an example where the gate is not connected to the signal terminal sitting at the center.

<Embodiment 2>

Figure 5:
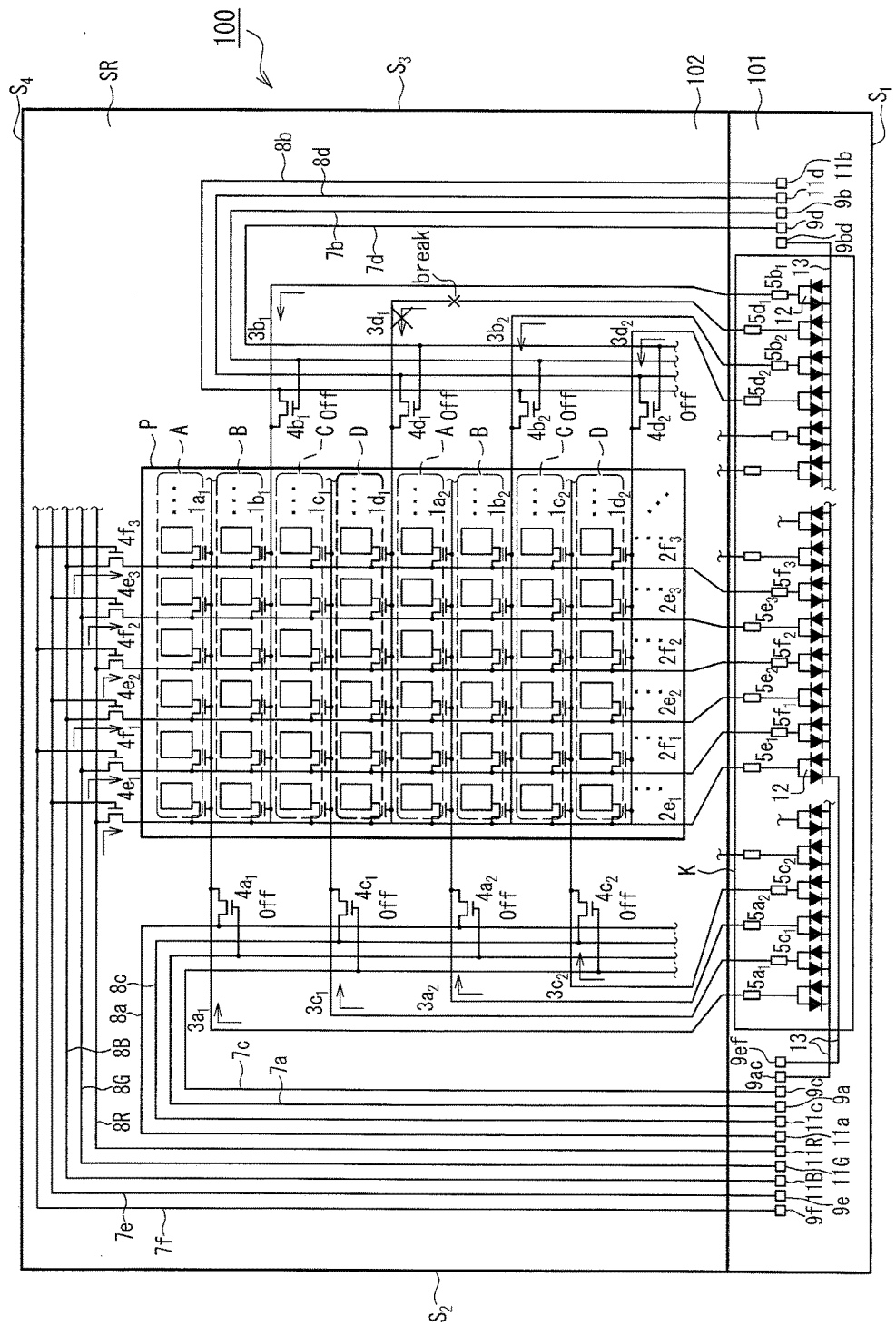
FIG. 5 is a plan view showing a schematic configuration of a liquid crystal panel according to Embodiment 2.

FIG. 5 is a plan view showing a schematic configuration of a liquid crystal panel 200 according to Embodiment 2. In FIG. 5, the same portions as in FIG. 1 are denoted by the same reference numerals. In the example shown in FIG. 5, the signal terminals 5 in the connection terminal region K are connected to a short line 13 through the bidirectional diodes 12. Specifically, the signal terminals 5a connected to the scanning lines 1a of the group A and the signal terminals 5c connected to the scanning lines 1c of the group C are connected, through the diodes 12, to one short line 13 connected to a test signal terminal 9ac. The signal terminals 5b connected to the scanning lines 1b of the group B and the signal terminals 5d connected to the scanning lines 1d of the group D are connected, through the diodes 12, to one short line 13 connected to a test signal terminal 9bd. The signal terminals 5e connected to the data lines 2e of the group E and the signal terminals 5f connected to the date lines 2f of the group F are connected, through the diodes 12, to one short line 13 connected to a test signal terminal 9ef.

That is, the active matrix substrate 101 according to the present embodiment includes the transistors 4 provided for inputting test signals to the bus lines (the scanning lines 1 and the data lines 2) in the pixel region P, the lines 7 for dividing the transistors 4 into groups to control the transistors 4 to be turned on/off on a group basis, and one or more short lines 13 placed in the connection terminal region K (in the vicinity of the input ends of the bus lines). And the bus lines are connected to the corresponding short lines 13 through the diodes 12. According to this configuration, it is possible to reduce the size of test elements in the connection terminal region K and to test not only the lines inside the pixel region but also the lines outside the pixel region for breaks.

Figure 6:
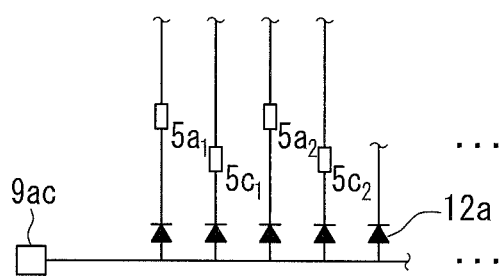
FIG. 6 is a diagram showing a modified example of connection elements.

FIG. 6 is a diagram showing a modified example of the connection elements. In the example shown in FIG. 6, the unidirectional diodes 12a are used as the connection elements in place of the bidirectional diodes 12. As a result, it is possible to further reduce the space for placing the connection elements. Note that unidirectional diodes whose direction is opposite to that of the unidirectional diodes 12a shown in FIG. 6 can also be used.

<Operation Example During Test>

Here, one example of a method for checking whether there is any break in each of the bus lines (the scanning lines 1 and the data lines 2) from the connection terminal region K (e.g., the IC mounting portion) to the pixel region P will be explained.

In this example, of the transistors 4 in the frame-shaped wiring region SR for switching test signals, the transistors 4a, 4b, 4c, 4d for the scanning lines are all turned off and the transistors 4e, 4f for the data lines are turned on. In this state, test signals to the data lines 2 are inputted from the additional signal terminals 11R, 11G, 11B. Furthermore, to the short line 13 connected to the scanning lines 1 through the diodes (i.e., to the test signal terminals 9ab, 9cd), test signals to the scanning lines are inputted. Hence, test signals are inputted to the data lines 2 of the groups E and F through the test lines 8R, 8G, 8B, and test signals are inputted to the scanning lines 1 of the groups A to D from the short line 13 through the signal terminals 5a to 5d and the connection lines 3a to 3b. All test signals to the scanning lines 1 are inputted through the diodes 12. It is desirable that the test signals inputted to the scanning lines 1 at this time are at a low frequency (or a DC potential).

When there is a break in the connection line $3d_1$ between the signal terminal $5d_1$ and the scanning line $1d_1$ as in the example shown in FIG. 5, no signal will be inputted only to the scanning line $1d_1$ of the group d. As a result, in the pixel region P, only the pixels corresponding to the line d become different from other pixel in display state, so that the presence or absence of breaks can be checked.

Conversely, by turning on the transistors 4a to 4d for the scanning lines 1 and turning off the transistors 4e, 4f for the data lines 2, the data lines 2e, 2f and in their connection lines can be tested for breaks as in above. For example, in the state where the transistors 4a to 4d for the scanning lines 1 are turned on and the transistors 4e, 4f for the data lines 2 are turned off, test signals are inputted to the scanning lines 1 from the additional signal terminals 11a, 11b, 11c, 11d, and test signals are inputted to the data lines 2 from the short line 13 to which the signal terminals 5e, 5f (test signal terminal 9ef) are connected. As a result, test signals are inputted to the data lines 2 of the groups E and F from the short line 13 through the signal terminals 5e, 5f and the connection lines 3e, 3f, and test signals are inputted to the scanning lines 1 of the groups A to D through the test lines 8a to 8b. All test signals to the data lines 2 are inputted through the diodes 12. As a result, it is possible to test the connection lines 3a to 3d in addition to the scanning lines 1 for breaks.

As in Embodiment 1, it is also possible to test the scanning lines 1 of the groups A to D by inputting test signals with the transistors 4a of the group A and the transistors 4b of the group B being turned on and the transistors of the groups C and D being turned off.

According to Embodiment 2, the area of the connection terminal region K for the test elements becomes larger than that in Embodiment 1, but it is possible to reduce the number of sections to be checked and thus the number of man-hours.

<Embodiment 3>

Figure 7:
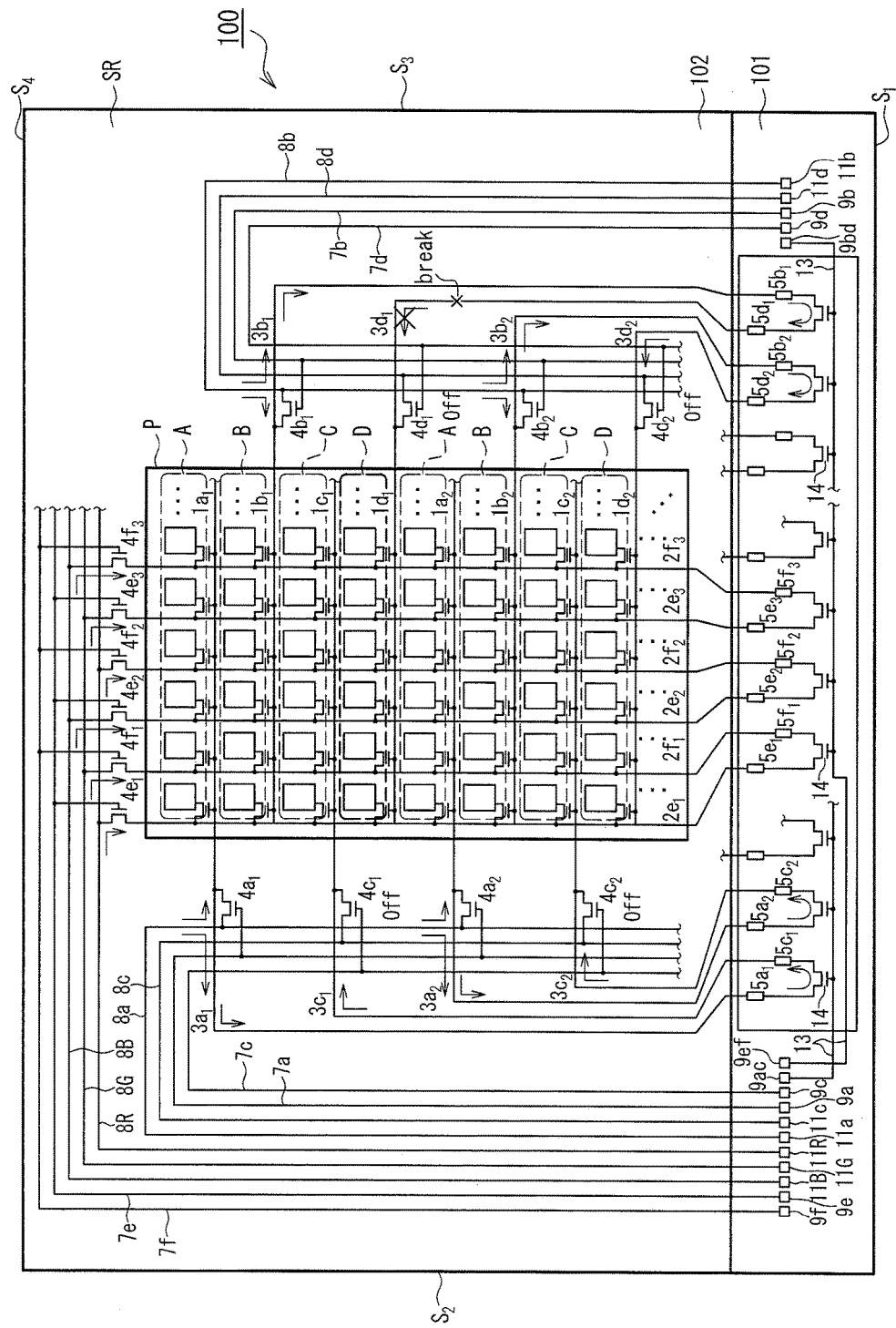
FIG. 7 is a plan view showing a schematic configuration of a liquid crystal panel according to Embodiment 3.

FIG. 7 is a plan view showing a schematic configuration of a liquid crystal panel 300 according to Embodiment 3. In FIG. 7, the same portions as in FIG. 1 are denoted by the same reference numerals. In the example shown in FIG. 7, each signal terminal 5 in the connection terminal region K is connected to only one adjacent signal terminal through a transistor 14. The source electrode and the drain electrode of each transistor 14 are connected to the signal terminals, and the gate electrode of each transistor is connected to one short line 13. Each signal terminal 5 is connected to one short line 13 through the transistor 14.

Specifically, the signal terminals 5a connected to the scanning lines 1a of the group A and the signal terminals 5c connected to the scanning lines 1c of the group C are connected, through the transistors 14, to one short line 13 connected to the test signal terminal 9ac. That is, each signal terminal is connected to only one adjacent signal terminal through the transistor 14. The drain electrodes of the transistors 14 are connected to the signal terminals 5a of the group A, the source electrodes of the transistors 14 are connected to the signal terminals 5c of the group C, and the gate electrodes of the transistors 14 are connected to the short line 13. As a result, every two signal terminals of the signal terminals 5 aligned are connected to each other through one transistor 14.

Similarly, the signal terminals 5b connected to the scanning lines 1b of the group B and the signal terminals 5d connected to the scanning lines 1d of the group D are connected, through the transistors 14, to one short line 13 connected to the test signal terminal 9bd. The signal terminals 5e connected to the data lines 2e of the group E and the signal terminals 5f connected to the data lines 2f of the group F are connected, through the transistors 14, to one short line 13 connected to the test signal terminal 9ef.

In the example shown in FIG. 7, the signal terminals connected to the bus lines belonging to different groups are connected to each other through a transistor. That is, the groups A and C are connected to each other, the groups B and D are connected to each other, and the groups E and F are connected to each other through the transistors 14 in the connection terminal region K.

The active matrix substrate 101 according to the present embodiment includes the transistors 4 provided for inputting test signals to the bus lines (the scanning lines 1 and the data lines 2) in the pixel region P, the lines 7 for dividing the transistors 4 into groups to control the transistors 4 to be turned on/off on a group basis, and the transistors 14 each of which is provided to connect every two lines in the connection terminal region K (in the vicinity of the input ends of the bus lines) to each other. According to this configuration, it is possible to reduce the size of the test elements in the connection terminal region K and to test not only the lines inside the pixel region but also the lines outside the pixel region for breaks.

<Operation Example During Test>

Here, one example of a method for checking whether there is any break in each of the bus lines (the scanning lines 1 and the data lines 2) from the connection terminal region K (e.g., the IC mounting portion) to the pixel region P will be explained.

In this operation example, of the transistors 4 for switching connections between the scanning lines 1 and the test lines 8, the transistors $4c_1$, $4c_2$ of the group C and the transistors $4d_1$, $4d_2$ of the group D are turned off, and the transistors of the remaining groups (A, B, E, F), i.e., the transistors 4a, 4b, 4e, 4f, are turned on. In this state, test signals are inputted from the additional signal terminals 11a, 11b. It is desirable that the test signals inputted to the scanning lines at this time are at a low frequency (or a DC potential). Further, test signals are inputted also to the data lines 2e, 2f, from the additional signal terminals 11R, 11G, 11B.

As a result, the test signals are inputted to the scanning lines 1a of the group A through the transistors 4a and are inputted to the scanning lines 1b of the group B through the transistors 4b. Further, the test signals that have been inputted to the groups A and B are inputted to the scanning lines 1c of the group C and the scanning lines 1d of the group D (and d) through the transistors 14 in the connection element region K. That is, the test signals that have been inputted to the scanning lines through the transistors 4a, 4b pass through the connection lines 3a, 3b and reach the signal terminals 5b. Then, they enter the connection lines 3c, 3b from the adjacent signal terminals 5c, 5d through the transistors 14, and are inputted to the scanning lines 1c, 1d. Here, if there is any break in the connection line $3d_1$ between the scanning line $1d_1$ and the signal terminal $5d_1$ as shown in FIG. 7, no test signal will be inputted to the scanning line $1d_1$. As a result, the pixels of the group d corresponding to the scanning line $1d_1$ do not get turned on. Consequently, the break in the connection line $1d_1$ can be detected.

In this way, by connecting the signal terminals of the bus lines belonging to different groups through the transistor 14 (e.g., between the signal terminals 5a and 5c), it is possible to test not only the bus lines (1a to 1d) of the respective groups (e.g., the groups A to D) but also the connection lines (3a to 3d) that connect the respective groups for breaks.

According to Embodiment 3, it is possible to further reduce the element area in comparison with Embodiments 1 and 2. Further, it is possible to reduce the number of sections to be checked in comparison with Embodiment 1.

Figure 8A:
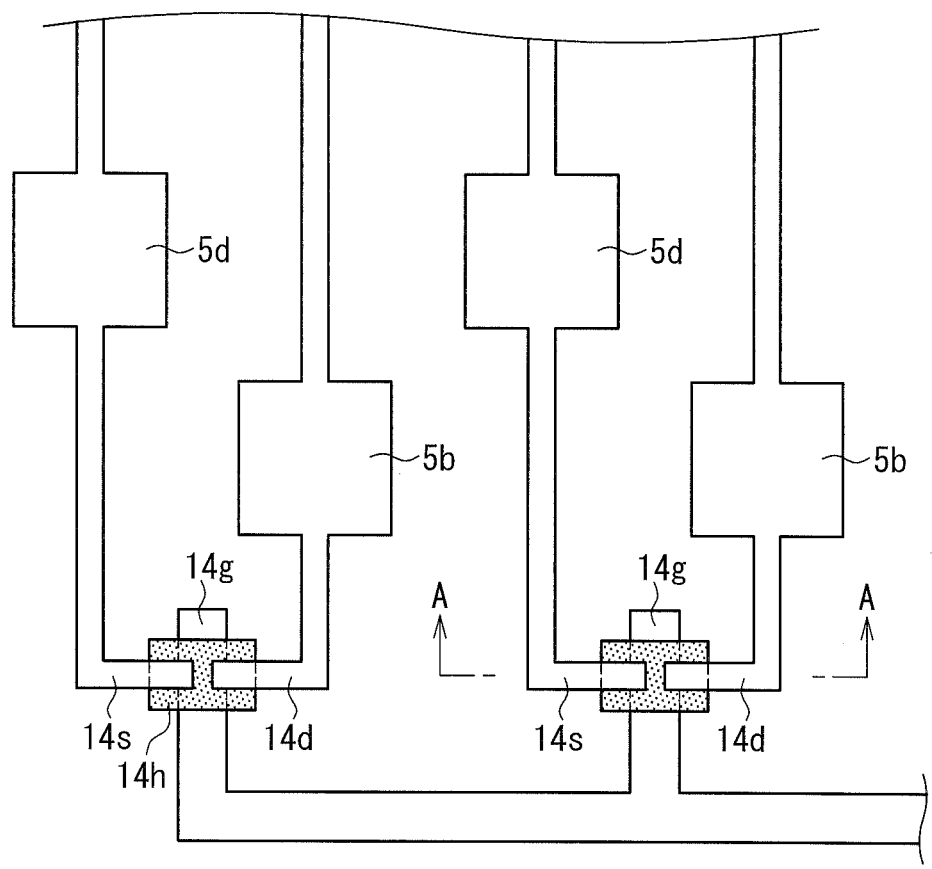
FIG. 8A is a plan view showing an exemplary configuration of transistors in the connection terminal region K shown in FIG. 7.
Figure 8B:
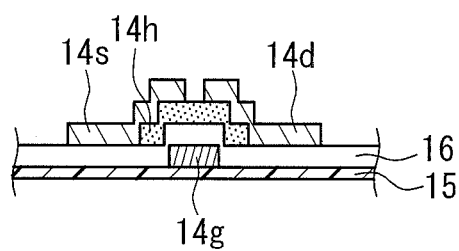
FIG. 8B is a cross-sectional view along the line A-A shown in FIG. 8A.

FIG. 8A is a plan view showing an exemplary configuration of the transistors 14 in the connection terminal region K shown in FIG. 7. FIG. 8B is a cross-sectional view along the line A-A shown in FIG. 8A. In the example shown in FIGS. 8A and 8B, between lines extending from electrodes forming the signal terminals 5b, 5d, a source electrode 14s extends inwardly from one of the lines and a drain electrode 14d extends inwardly from the other line, and they oppose each other around midway between the two lines. The gate electrode 14g is provided such that it runs below the area between the tip of the source electrode 14s and the tip of the drain electrode 14d, and partially overlaps with the tip of the source electrode 14s and the tip of the gate electrode 14g. An insulating layer 16 is provided on the gate electrode 14g such that the gate electrode 14g is covered with the insulating layer 16. And on the insulating layer 16, a semiconductor layer 14h is formed so as to overlap with the gate electrode 14g. The semiconductor layer 14h is formed in the area from the tip of the source electrode 14s to the tip of the drain electrode 14d. Of the semiconductor layer 14h, the area between the gate electrode 14g and the source electrode 14s is a source area, and the area between the gate electrode 14g and the drain electrode 14d is a drain area. Of the semiconductor layer 14h, the area between the source area and the drain area serves as a channel area.

Further, a shielding film 15 for shielding the transistors 4 from external light is provided between the gate electrode 14g and the substrate (not shown). For example, the shielding film 15 may be provided in the entire connection terminal region K or only at the portions where the transistors 14 are formed. It is preferable that the shielding film 15 is made of a material that is less reflective and less translucent. For example, it is preferable to use an organic film having a high OD (Optical Density) value to form the shielding film 15, but the material of the shielding film 15 is not particularly limited.

The configuration of the transistors is not limited to the example shown in FIGS. 8A and 8B. For example, the transistors may be configured such that the positional relationship between the gate electrode and the source and drain electrodes is upside down (a so-called top gate type). Similarly, the transistors forming the diodes as shown FIGS. 3A and 3B also may be of a top gate type.

<Modified Example>

Figure 9:
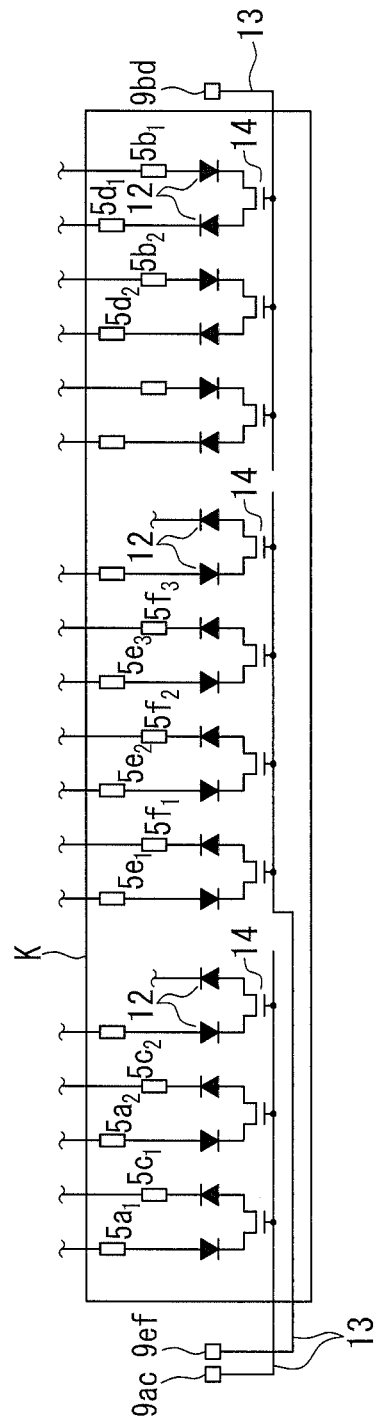
FIG. 9 is a diagram showing a modified example of connection elements in the connection terminal region.

FIG. 9 is a diagram showing a modified example of the connection elements in the connection terminal region K. In the example shown in FIG. 9, each signal terminal 5 is connected to one adjacent signal terminal through one transistor 14. The source electrode and the drain electrode of each transistor 14 are connected to the signal terminals through the diodes 12, and the gate electrode of each transistor 14 is connected to the short lines 13. The direction of the diode 12 connected to the source electrode and the direction of the diode 12 connected to the drain electrode are set such that a current flows from the source electrode to the drain electrode or from the drain electrode to the source electrode.

For example, with respect to the transistor 14 and the diodes 12 that connect the signal terminal 5a connected to the scanning line of the group A to the signal terminal 5c connected to the scanning line of the group C, the direction of the diodes 12 is set such that a current flows from the signal terminal 5a of the group A to the signal terminal 5c of the group C. In this way, according to the configuration shown in FIG. 9, it is possible to control signal terminal connections between given groups through the transistors 14 and the diodes 12. Note that the configuration shown in FIG. 9 is merely an example, the configuration of combination of the transistors 14 and the diodes 12 is not limited to this example.

<Severing Examples>

In Embodiments 1 to 3, the step of severing the connection elements in the connection terminal region K, such as the diodes 12 and the transistors 14, may be performed after the testing step. Specifically, the step of electrically separating the diodes 12 and the transistors 14 shown in FIGS. 1, 4 and 7 from the signal terminals 5 may be included. Specifically, lines between the signal terminals 5 and the diodes 12 or the transistors 14 may be severed. For example, the lines may be severed with a laser.

Figure 10A:
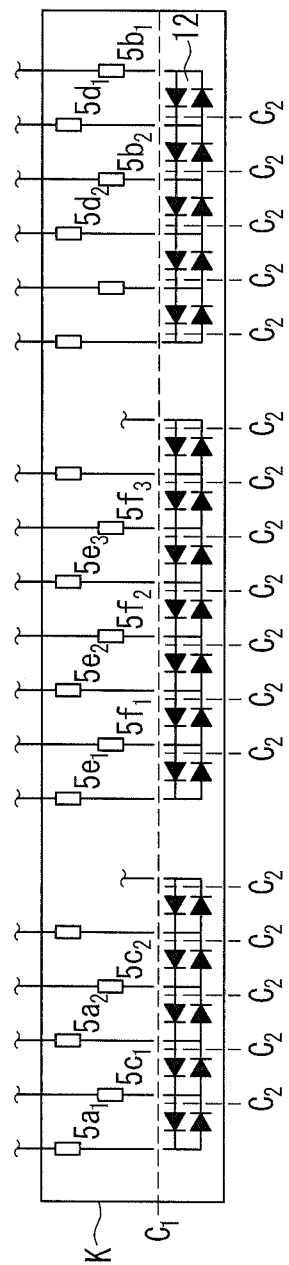
FIG. 10A is a diagram showing a circuit configuration after the severance of the lines between the connection elements and the signal terminals in the connection terminal region.
Figure 10B:
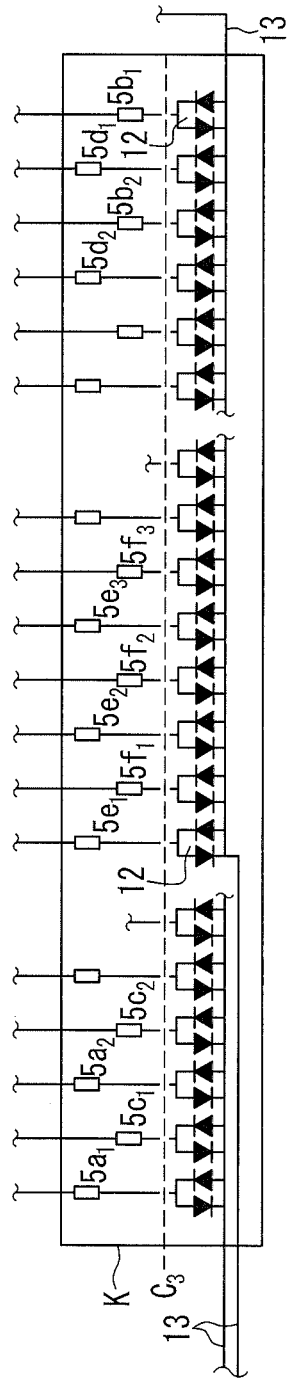
FIG. 10B is a diagram showing a modified example of the severing line.

FIG. 10A is a diagram showing a circuit configuration in the connection terminal region K shown in FIG. 1 after the severance of the lines between the signal terminals 5 and the diodes 12 as the connection elements. In the example shown in FIG. 10A, the lines are severed along a dotted line $C_1$ as a severing line running between the signal terminals 5 and the diodes 12. The severing line is not limited to $C_1$, and $C_2$ can be used as severing lines. FIG. 10B is a diagram showing a circuit configuration in the connection terminal region K shown in FIG. 5 after the severance of the lines between the signal terminals 5 and the diodes 12 as the connection elements. In the example shown in FIG. 10B, the lines are severed along a dotted line $C_3$ as a severing line running between the signal terminals 5 and the diodes 12.

The portions to be severed are not limited to those in the examples shown in FIGS. 10A and 10B. For example, at least a part of lines between the connection elements, lines connected to the connection elements, and lines around connection the elements can be severed.

<Modified Example of Grouping of Switching Elements and Lines>

In Embodiments 1 to 3, the scanning lines 1 are divided into the groups A to D, and the data lines 2 are divided into the groups E and F, and control lines for controlling the transistors 4 on a group basis are provided. That is, the scanning lines 1 and the data lines 2 are both divided into a plurality of groups but the groupings are not limited to this.

For example, one of the scanning lines 1 and the data lines 2 can be grouped together and the other can be to divide into a plurality of groups. For example, when performing a continuation test on the data lines 2 with the scanning lines 1 always being turned on or off, the scanning lines 1 can be grouped together.

Further, in Embodiments 1 to 3, the control lines 7a to 7f for turning the transistors 4 on/off are provided for the groups A to F, respectively, but it is possible to connect the gate electrodes of the transistors 4 of different groups collectively to one control line. That is, the gate electrodes of the switching elements that belong to different groups may be connected to a common control line. For example, in FIG. 1, the transistors 4a, 4c, are respectively connected to the scanning lines of the groups A and C, the groups of the scanning lines drawn to the left side of the pixel region P, and the gate electrodes of the transistors 4a and the gate electrodes of the transistors 4c are connected to the control lines 7a, 7c, respectively. However, the control line 7a for the transistors 4a and the control line 7c for the transistors 4c can be brought together into one line. In this way, by collectively shearing a control line among different groups, the number of lines can be reduced, thereby facilitating a reduction in the frame area. When brining control lines for different groups together, input signals can be controlled on a group basis by providing additional connection lines for each group.

Further, for the scanning lines 1 in Embodiments 1 to 3, the additional connection lines 8a to 8d are provided for the groups A to D, respectively, but it is possible to connect the scanning lines of different groups collectively to one additional connection line. For example, in FIG. 1, the additional connection lines 8a, 8c that are connected to the scanning lines of the respective groups A and C, the groups of the scanning lines drawn to the left side of the pixel region P, can be brought together into one line. Also by brining the additional connection lines together, the number of lines can be reduced, thereby facilitating a reduction in the frame area. When brining additional connection lines of different groups together, input signals can be controlled on a group basis by, for example, providing additional connection lines for each group.

As described above, paths through which signals are inputted to the bus lines from the additional signal terminals through the additional connection lines may be collectively sheared among different groups or may be provided for each group. Further, the control lines for the switching elements for controlling connections between the additional connection lines and the bus lines may be collectively shared among different groups or may be provided for each group. In this way, it is possible to correspond the additional connection lines and the control lines with each groups as needed.

Figure 11:
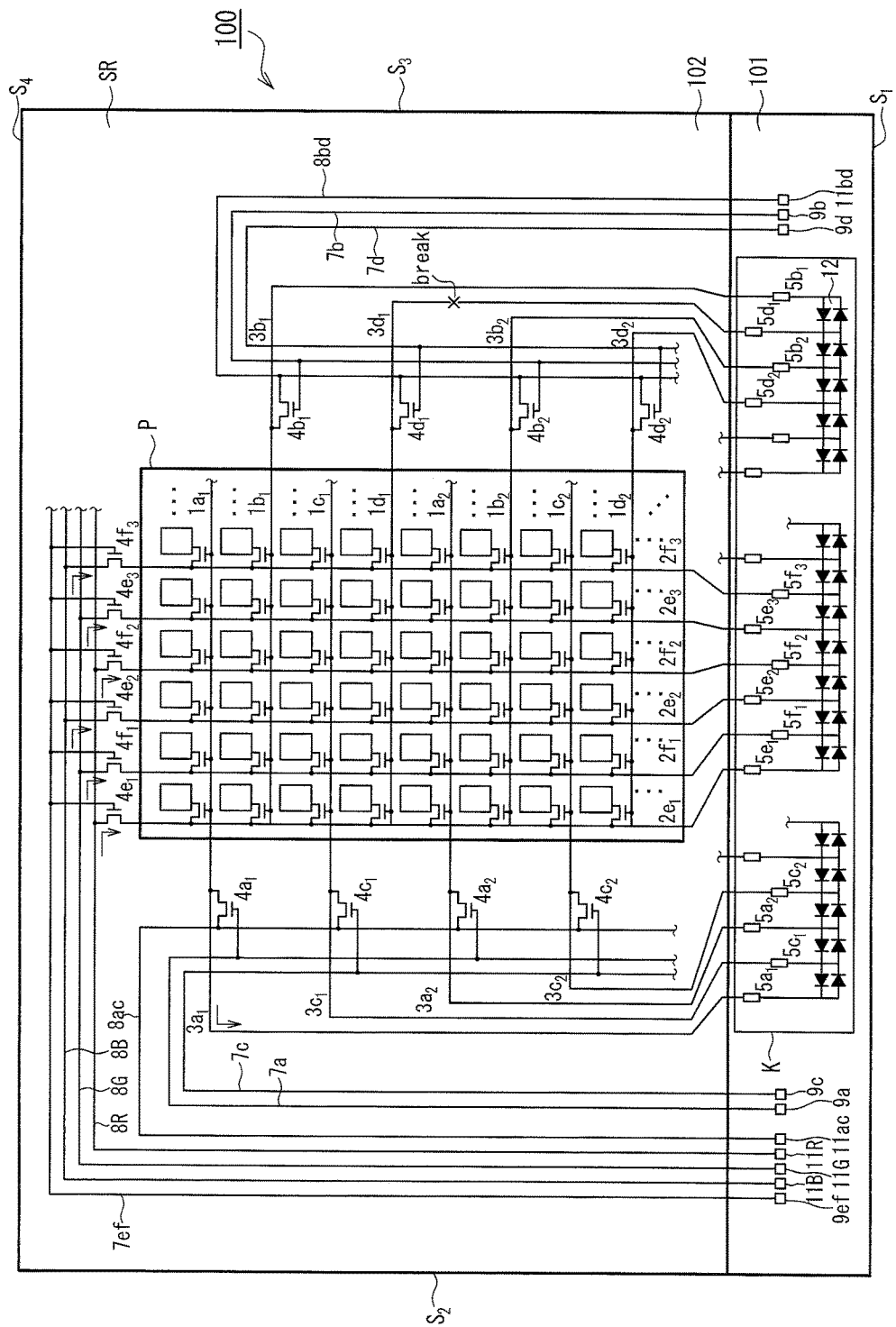
FIG. 11 is a diagram showing one modified example of the switching elements and the lines.

FIG. 11 is a diagram showing a modified example of the switching elements and the lines. In the example shown in FIG. 11, the scanning lines 1a, 1c, (the groups A, C) drawn to the right side of the pixel region P are both connected to a common additional connection line Sac. The scanning lines 1b, 1d, (the groups B, D) drawn to the left side of the pixel region P are both connected to a common additional connection line Bbd. For the data lines 2e, 2f (the groups E, F) drawn to the upper side of the pixel region, the gate electrodes of the transistors 4e, 4f are connected to a common control line 7. The operations during the test in the example shown in FIG. 11 can be performed in the same manner as in Embodiment 1.

The liquid crystal panels according to Embodiments 1 to 3 can be used in electronic devices for portable terminal uses, such as mobile phones, PDAs (Personal Digital Assistants), PHS (Personal Handy-phone System) devices, and HHTs (hand held terminals). In addition to electronic devices for portable terminal uses, the liquid crystal panels can also be used in such electronic devices as game terminals, car navigation systems, personal computers, television sets, video cameras, and digital cameras.

The application of the active matrix substrate 101 according to each of Embodiments 1 to 3 is not limited to a liquid crystal panel. For example, the active matrix substrate 101 can also be used in such panels (display devices) as field emission displays, plasma displays, and organic EL displays.

It is possible to form a liquid crystal display device by further providing the liquid crystal panel according to each of Embodiments 1 to 3 with a light source unit and a driver IC or an FPC connected to a driver.

INDUSTRIAL APPLICABILITY

As described above, the present invention is useful as an active matrix substrate, a display device, a method for testing the active matrix substrate, and a method for testing the display device.

The invention claimed is:
1. An active matrix substrate comprising:
a plurality of bus lines provided in a pixel region;
a plurality of signal terminals that input a driving signal to each of the bus lines, the plurality of signal terminals being provided in a connection terminal region situated outside the pixel region;
connection lines that connect the plurality of signal terminals to the bus lines;
additional signal terminals that input a signal to the bus lines through different paths from those used in inputting the driving signal from the plurality of signal terminals, the additional signal terminals being provided outside the pixel region;

additional connection lines that connect the bus lines to the additional signal terminals;

a plurality of switching elements that control connections between the bus lines and the additional connection lines;

control signal terminals that are provided outside the pixel region; and control lines that connect the control signal terminals to the plurality of switching elements; wherein the plurality of switching elements are divided into a plurality of groups, and control connections between the plurality of bus lines and the additional connection lines on a group basis, first terminals of the plurality of switching elements are directly connected to the connection lines, second terminals of the plurality of switching elements are directly connected to the additional connection lines, control terminals of the plurality of switching elements are directly connected with the control lines, connection elements that each comprise a diode or a switching element and connect the plurality of signal terminals to each other are provided in the connection terminal region.

2. The active matrix substrate according to claim 1, wherein the connection elements are each provided between the plurality of signal terminals connected to the bus lines belonging to different groups.

3. The active matrix substrate according to claim 1, wherein the connection elements are bidirectional diodes, unidirectional diodes or transistors.

4. The active matrix substrate according to claim 1, wherein each of the plurality of signal terminals is connected to only one adjacent signal terminal through the connection element.

5. The active matrix substrate according to claim 1, further comprising a short line that connects the pluality of signal terminals and an additional signal terminal that inputs a signal for turning pixels on, wherein the connection elements are provided between the plurality of signal terminals and the short line.

6. The active matrix substrate according to claim 1, further comprising a plurality of short lines that connect a plurality of sets of the plurality of signal terminals and a plurality of the additional signal terminals, respectively, wherein the connection elements are provided between the signal terminal of the respective sets and the short lines, and each of the sets includes the plurality of signal terminals connected to the switching elements belonging to at least one of the groups.

7. The active matrix substrate according to claim 5, wherein the connection elements are transistors that control connections between the plurality of signal terminals, and a drain electrode and a source electrode of each transistor are connected to two of the plurality of signal terminals and a gate electrode of each transistor is connected to the short line.

8. The active matrix substrate according to claim 1, further comprising a shielding film that shields the connection elements from external light.

9. The active matrix substrate according to claim 1, wherein at least one connection element is provided for every three continuous ones of the plurality of signal terminals, and connects the one of the plurality of signal terminals at a center of the three continuous ones of the plurality of signal terminals to two of the plurality of signal terminals on both sides.

10. A display device comprising the active matrix substrate according to claim 1.

* * * * *